United States Patent

Chien et al.

[11] Patent Number: 6,030,867
[45] Date of Patent: Feb. 29, 2000

[54] METHOD OF FABRICATING A FIN/HSG DRAM CELL CAPACITOR

[75] Inventors: Sun-Chieh Chien, Hsinchu; Jason Jenq, Pingtung; Der-Yuan Wu; Chia-Wen Liang, both of Hsinchu, all of Taiwan

[73] Assignee: United Microelectronics Corp., Taiwan

[21] Appl. No.: 08/975,708

[22] Filed: Nov. 21, 1997

Related U.S. Application Data

[60] Provisional application No. 60/058,637, Sep. 12, 1997.

[51] Int. Cl.⁷ .............................................. H01L 21/8242
[52] U.S. Cl. .......................... 438/255; 438/398; 438/397; 257/309
[58] Field of Search ...................... 438/386, 387, 438/389, 390, 391, 392, 393, 394, 395, 396, 253, 255, 453, 398

[56] References Cited

U.S. PATENT DOCUMENTS

| | | | |
|---|---|---|---|
| 5,188,975 | 2/1993 | Kojima et al. | 438/396 |
| 5,401,681 | 3/1995 | Dennison | 438/253 |
| 5,422,315 | 6/1995 | Kobayashi | 438/453 |
| 5,447,878 | 9/1995 | Park et al. | 438/396 |
| 5,753,552 | 5/1998 | Sheng | 438/253 |
| 5,960,280 | 9/1999 | Jenq et al. | 438/254 |

*Primary Examiner*—Wael Fahmy
*Assistant Examiner*—William David Coleman
*Attorney, Agent, or Firm*—Rabin & Champagne PC

[57] ABSTRACT

The DRAM cell is formed by covering the cell's transfer FET with a conformal insulating layer. A self aligned contact etch removes a portion of the conformal insulating layer from above a first source/drain region of the FET and then a first polysilicon layer is deposited over the device. Etching defines a polysilicon pad from the first polysilicon layer with edges of the polysilicon pad disposed over the gate electrode and an adjacent wiring line. A thick, planarized second insulating layer is provided over the device, filling the volume defined by the locally cupped surface of the polysilicon pad. Etching is performed to remove a portion of the planarized insulating layer using the pad polysilicon layer as an etch stop for the process. A second, thick polysilicon layer is next provided to fill the cavity and the layer is patterned to laterally define the lower capacitor electrode. Hemispherical grained silicon (HSG-Si) is deposited on the surface of the patterned polysilicon layer and an etch back process is used to transfer the topology of the HSG-Si layer to the underlying polysilicon. Further processing provides a capacitor dielectric and an upper electrode.

24 Claims, 6 Drawing Sheets

METHOD OF FABRICATING A FIN/HSG DRAM CELL CAPACITOR

This application claims priority from provisional application Ser. No. 60/058,637, filed Sep. 12, 1997.

BACKGROUND OF THE INVENTION

1. Field of the Invention

The present invention relates to the formation of high density integrated circuits and, more particularly, to the formation of high density dynamic random access memories.

2. Description of the Related Art

There is a continuing trend toward increasing the storage density of integrated circuit memories to provide increased levels of data storage on a single chip. Higher density memories provide storage that is generally more compact and is often cheaper on a per bit basis than an equivalent amount of storage provided on plural chips. It has generally been possible to provide these higher levels of storage at equivalent or improved levels of performance as compared to the earlier, less dense memory chips. Historically, the density of integrated circuit devices has been increased in part by decreasing the size of structures such as wiring lines and transistor gates as well as by decreasing the separation between the structures that make up the integrated circuit device. Reducing the size of circuit structures is generally referred to as decreasing the "design rules" used for the manufacture of the integrated circuit device.

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one, or vice versa. The surface area of the electrodes of the memory capacitors determines the amount of charge that can be stored on each of the capacitors for a given operating voltage, for the electrode separation that can reliably be manufactured, and for the dielectric constant of the capacitor dielectric used between the electrodes of the charge storage capacitor. Read and write operations are performed in the memory by selectively coupling the charge storage capacitor to a bit line to transfer charge either to or from the charge storage capacitor. The selective coupling of the charge storage capacitor to the bit line is accomplished using a transfer field effect transistor (FET). A contact between the bit line and the transfer FET is made to one of the source/drain electrodes of the transfer FET and the charge storage capacitor is formed in contact with the other of the source/drain electrodes of the transfer FET. Word line signals are supplied to the gate of the FET to selectively connect the lower electrode of the charge storage capacitor through the transfer FET to the bit line contact, facilitating the transfer of charge between the charge storage capacitor and the bit line.

Applying reduced design rules to a DRAM reduces the substrate surface area that can be devoted to the charge storage capacitors of the DRAM. Thus, applying reduced design rules to conventional planar capacitor designs reduces the amount of charge (i.e., capacitance) that can be stored on the charge storage capacitor. Reducing the amount of charge on the capacitor leads to a variety of problems, including the potential loss of data due to greater susceptibility to decay mechanisms and to charge leakage. This greater susceptibility to charge loss may cause the DRAM to require more frequent refresh cycles, which is undesirable since the memory may be unavailable for data storage and readout transactions during refresh activities. In addition, reduced levels of charge storage might require more sophisticated data readout schemes or more sensitive charge sensing amplifiers. Thus, modern DRAMs require increased levels of capacitance in reduced substrate area DRAM cells. To this end, a variety of very complex capacitor structures having three dimensional charge storage surfaces have been proposed. In general, these complex capacitor structures are difficult to manufacture.

SUMMARY OF THE PREFERRED EMBODIMENTS

It is accordingly an object of the present invention to provide a more manufacturable DRAM incorporating an increased capacitance charge storage capacitor.

An aspect of the present invention forms an integrated circuit device by providing a transfer FET having a gate electrode and a source/drain region and providing a wiring line spaced from the gate electrode. A dielectric layer is deposited over the transfer FET and the gate electrode. The dielectric layer is etched to expose a surface of the source/drain region, with portions of the dielectric layer remaining over the gate electrode and over the wiring line. A first conductive layer is deposited and patterned to form a conductive pad in contact with the source/drain region, with edges of the conductive pad positioned over the gate electrode and the wiring line. An insulating layer is deposited over the first conductive layer and planarized. The insulating layer is deposited to a sufficient thickness so that a surface of the planarized insulating layer extends above the edge of the conductive pad over the gate electrode. An opening is formed in the planarized insulating layer extending from the surface of the planarized insulating layer to expose a surface of the conductive pad so that edges of the opening are positioned on the surface of the conductive pad. A second conductive layer is provided to fill the opening in the planarized insulating layer. An etching mask is provided over the second conductive layer and etching is performed through the second conductive layer to expose the surface of the planarized insulating layer and to form a patterned second conductive layer. A capacitor dielectric layer is provided over the second conductive layer and an upper capacitor electrode is provided over the capacitor dielectric layer.

DETAILED DESCRIPTION OF THE PREFERRED EMBODIMENTS

Preferred embodiments of the present invention provide a DRAM having an array of high capacitance charge storage capacitors formed in an efficient process flow which includes process limits to improve the yields from high failure rate process steps, including such process steps as long duration, time controlled etching steps. The process is additionally designed to limit the occurrence of such low yield steps. In accordance with particularly preferred embodiments of the present invention, a transfer FET is provided on a substrate and the transfer FET is covered by a first insulating layer. A self aligned contact etch removes a portion of the first insulating layer from above a first source/drain region of the FET and then a first polysilicon layer is deposited on the surface of the device in contact with the first source/drain region. Etching defines a polysilicon pad from the first polysilicon layer. Edges of the polysilicon pad are disposed over the gate electrode and the wiring line and the surface of the polysilicon pad defines a locally cupped conductive surface connected to the first source/drain region of the transfer FET. A planarized insulating layer is provided over the device, filling the volume defined by the locally cupped surface. An etching mask is provided over the planarized insulating layer with an opening positioned over the first source/drain, and then etching is performed to remove a portion of the planarized insulating layer using the pad polysilicon layer as an etch stop for the process. A second, thick polysilicon layer is next provided to fill the cavity and then the second, thick polysilicon layer is patterned to laterally define the lower capacitor electrode, preferably leaving portions of the second polysilicon layer extending above the stepped opening and onto surrounding portions of the second insulating layer. Hemispherical grained silicon (HSG-Si) is deposited on the surface of the patterned polysilicon layer and an etch back process is used to transfer the topology of the HSG-Si layer to the underlying polysilicon. Further processing provides a capacitor dielectric and an upper electrode.

Figure 1:
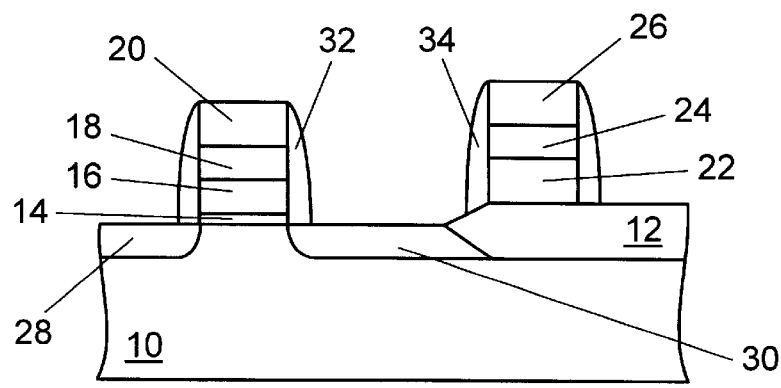
FIGS. 1–14 illustrate steps in forming a DRAM in accordance with preferred embodiments of the present invention.
Figure 2:
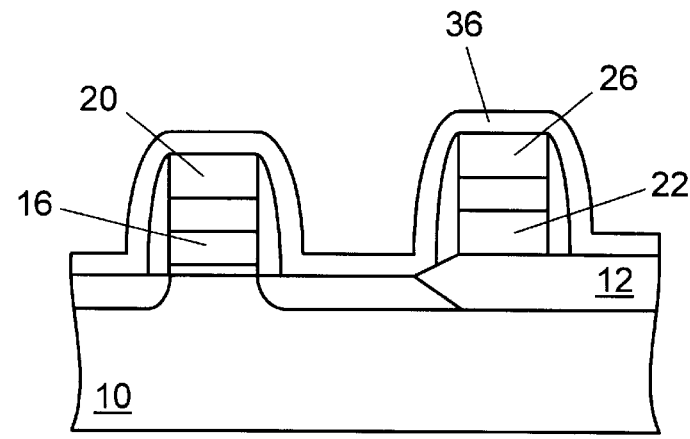

These and other aspects of the present invention are now described in greater detail with particular reference to FIGS. 1–14. Many aspects of the manufacture of DRAMs are conventional and well known to those practicing in the art. As such, the following discussion omits certain of the details of the manufacturing process and presents in summary still other aspects of the manufacturing process to better emphasize the distinctive teachings of the present invention. FIG. 1 shows in schematic cross-section an illustrative cell of the many cells of a DRAM at an intermediate stage of manufacture in accordance with the present invention. The exemplary DRAM cell is formed on a P-type substrate 10 which has on its surface an array of field oxide device isolation regions 12 that provide isolation between the various memory cells and devices of the DRAM. The device isolation regions might be formed using a modified local oxidation of silicon (LOCOS) method, as schematically illustrated, or might be formed as shallow trench isolation structures. Shallow trench isolation structures might be formed by etching trenches into the substrate, refilling the trenches with oxide in a chemical vapor deposition (CVD) process, and planarizing the surface of the device in a chemical mechanical polishing (CMP) process.

Formation of the exemplary DRAM continues by providing a multilayer stack consisting of a gate oxide layer 14 on the active device regions, a layer of conductive material including at least a layer of doped polysilicon over the substrate, followed by a protective dielectric layer. Particular materials are identified here to more effectively illustrate embodiments of the invention, but it should be understood that other individual materials and other combinations of at least some of these materials might well be used instead to implement the general methods of the present invention. The gate oxide layer 14 is grown on the surface of the substrate to a typical thickness of about 30–200 Å by thermal oxidation in an oxygen environment at a temperature of 800–1000° C. Gate oxide layer 14 covers the active device regions defined between the field oxide device isolation regions 12. Soon after the gate oxide layer is grown, a first layer of polysilicon is deposited by low pressure chemical vapor deposition (LPCVD) over the surface of the device to a thickness of 1000–3000 Å and more preferably to a thickness of approximately 1500–2500 Å. This first polysilicon layer will be incorporated into the gate electrodes of the transfer FETs and the wiring lines that extend between the gate electrodes of adjacent cells. The gate electrode polysilicon layer is either doped in situ during deposition or by ion implantation, typically using arsenic or phosphorus, followed by annealing in the conventional fashion. A layer of a metal or metal silicide might then be provided over the surface of the polysilicon layer to reduce the resistivity of the gate electrode and wiring line conductors. The metal layer is preferably tungsten silicide ($WSi_x$) or titanium silicide ($TiSi_x$) having a thickness of about 1500 Å which is preferably deposited directly by chemical vapor deposition or by using sputtering or another physical vapor deposition technique. It should be noted that both more and less complicated gate electrode and wiring line structures might be used. A protective oxide layer is next provided over the conductive layers to a thickness of about 1000 Å or more by CVD or a comparable method. The oxide protective layer primarily serves to protect the gate electrode during subsequent processing steps.

After formation of the multilayer stack of gate electrode conductive layer covered by protective oxide layer, a photoresist etch mask is provided on the surface of the oxide layer and etching is performed through the various layers of the multilayer stack. Etching through the preferred protective oxide layer is accomplished using, for example, reactive ion etching (RIE) with a $CF_4$ source gas. Etching through the silicide layer can be accomplished in an RIE process using etchants derived from $Cl_2$ or HCl source gases. Etching through the polysilicon layer 16 is accomplished by RIE or another plasma etching process using a chlorine etch chemistry or using an etchant derived from HCl and HBr source gases. Although it is possible that the gate oxide layer 14 will be etched through at the end of the polysilicon etching process, additional oxide will generally grow on the surface of the substrate during a subsequent ion implantation and annealing process. After the various layers are etched through, a pattern of gate electrodes including a first polysilicon layer 16 covered by a like patterned silicide layer 18 is provided and covered by patterned protective oxide layers 20. Similar multilayer wiring line structures including a polysilicon layer 22, a silicide layer 24 and a capping oxide layer 26 are formed at the same time that the gate electrode structure is formed.

Doped source/drain regions 28, 30 are formed on either side of the polysilicon gate electrode to define the channel region of the transfer transistor. In some instances, a lightly doped drain (LDD) structure might be used in small design rule memory transistors of the type that are primarily used in modern memory and logic devices. LDD source/drain regions are typically formed in a two step process, beginning with a relatively low level dopant implantation made self-aligned to the gate electrode structure. Subsequently, spacer oxide regions 32 can be formed on either side of the gate electrode by first depositing a layer of CVD oxide over the device and then anisotropically etching back the oxide layer to expose the substrate over the source/drain regions 28, 30. Etching back the CVD oxide layer produces the spacer oxide structures 32 on either side of the polysilicon gate electrode 16 and spacer oxide structures 34 on either side of the polysilicon wiring line 22. Alternately, the spacer structures 32, 34 might be formed in an etch back process from a layer of CVD nitride. Nitride spacers are expected to be preferred for design rules of 0.25 $\mu$m or smaller. After the spacer structures 32 are provided on either side of the polysilicon gate electrode 16, a second, heavier ion implantation is made into the source/drain regions 28, 30, self-aligned to the spacer oxide regions 32. In most present day DRAM applications, however, it is preferred to not utilize an LDD structure for the source/drain regions, particularly for the capacitor contacts, and instead to use a single doping to produce more uniformly doped source/drain regions. Moderately doped source/drain regions 28, 30 might then be formed by ion implantation self-aligned to the gate electrodes. For example, the source/drain regions might be formed by implanting arsenic or phosphorus ions at an energy of 30–100 KeV to a dosage of between about $1 \times 10^{13}/cm^2$ to $1 \times 10^{14}/cm^2$. For these presently preferred alternate embodiments, it is nevertheless preferred that the spacer structures 32, 34 be provided alongside the gate electrodes and wiring lines, as illustrated in FIG. 1, to provide protection to the gate electrodes and wiring lines during subsequent processing steps.

Figure 3:
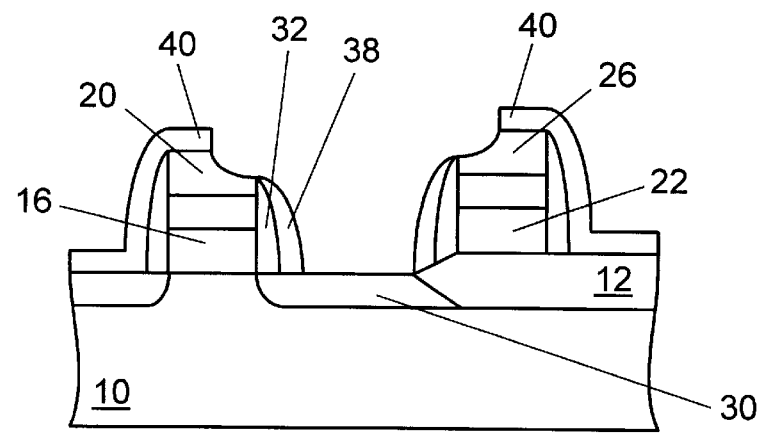

After the transfer FETs and wiring lines are formed, a layer of oxide 36 (FIG. 2) is deposited in a low pressure chemical vapor deposition (LPCVD) process from a TEOS source gas to a thickness of about 1000–2000 Å. The oxide layer 36 deposited in this fashion will cover the gate electrode structure and wiring line structure in an essentially conformal manner. This oxide layer provides a protective barrier and etch stop layer for portions of the subsequent process of forming the lower capacitor electrode structure for the DRAM cell. The capacitor contact opening is defined by providing an etch mask having an opening positioned over the source/drain region 30 on which the lower capacitor electrode will be formed. The opening in the etch mask is preferably larger than the source/drain region 30 and larger than the minimum spacing between the gate electrode and wiring line. By providing such a wide opening, the capacitor contact opening can be formed in a self-aligned etch back process. The etch back step may be performed, for example, in a Tokyo Electron dielectric etching system such as the TEL 5000 using an etchant derived in a plasma process from a flow of source gases such as 30 sccm $CHF_3$, 30 sccm $CF_4$ and 250 sccm Ar at a chamber pressure of about 200 mTorr and an input power of 800 W. Etching continues through the CVD oxide layer 36 until the surface of the source/drain region 30 is exposed and cleared of oxide, as shown in FIG. 3. Typically, additional thin oxide spacer structures 38 are formed alongside spacers 32, 34 in this etch back process and provide further insulation around the gate electrode to reduce the likelihood of shorting between the gate electrode and the lower capacitor electrode. This etching process preferably removes only a portion of the capping oxide layers 20, 26 over the gate electrodes 16 and wiring lines 22. Remaining portions 40 of the oxide layer remain over portions of the device other than the immediate region around the source/drain region 30 to which the lower capacitor electrode is connected. The photoresist etch mask is then stripped or removed by ashing, producing the structure shown in FIG. 3.

Figure 4:
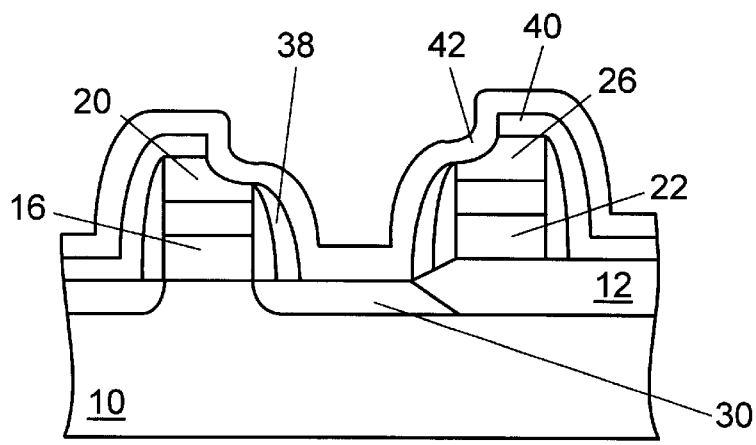
Figure 5:
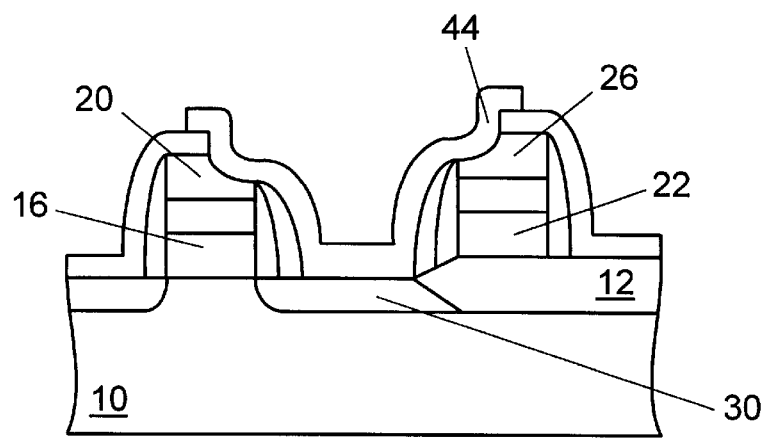

Formation of the lower capacitor electrode proceeds by depositing a second layer of polysilicon 42 over the device, as shown in FIG. 4. The second layer of polysilicon 42 is in contact with the source/drain region 30 to which the lower capacitor electrode is connected but is insulated from the source/drain region 28 to which the bit line is connected. The second polysilicon layer 42 can be deposited to a thickness of approximately 1000–2000 Å in an LPCVD process. The second polysilicon layer 42 is doped either in situ during deposition or by subsequent ion implantation and annealing. Preferably, the doping level for the second polysilicon layer 42 is comparatively high because it will be used to connect the source/drain region 30 to other portions of the capacitor electrode. Second level polysilicon layer 42 is next patterned to define a pad for the lower capacitor electrode. Patterning is accomplished by first providing a photoresist mask with a blocking mask element substantially centered over the source/drain region 30 and then the polysilicon layer 42 is etched using a Lam Research TCP etching system and a chlorine etch chemistry or an etchant derived from a mixture of source gases including HCl and HBr. This etching process preferably stops on the remaining portions of the oxide layer 40, which serve as an etch stop layer for this step. The resulting pad 44 of doped polysilicon is shown in FIG. 5. This doped polysilicon pad is an important element of the process, in that it serves as an etch stop for the process used to open a cavity over the source/drain region 30. The use of a pad polysilicon layer protects the source/drain region from being etched should the oxide etching process used to expose the pad later in the process flow is performed well outside of the etching step's process limits. The cavity is filled with a conductor which becomes a part of the lower electrode of the DRAM charge storage capacitor. Additionally, the pad polysilicon layer 44 preferably becomes part of the lower electrode.

Figure 6:
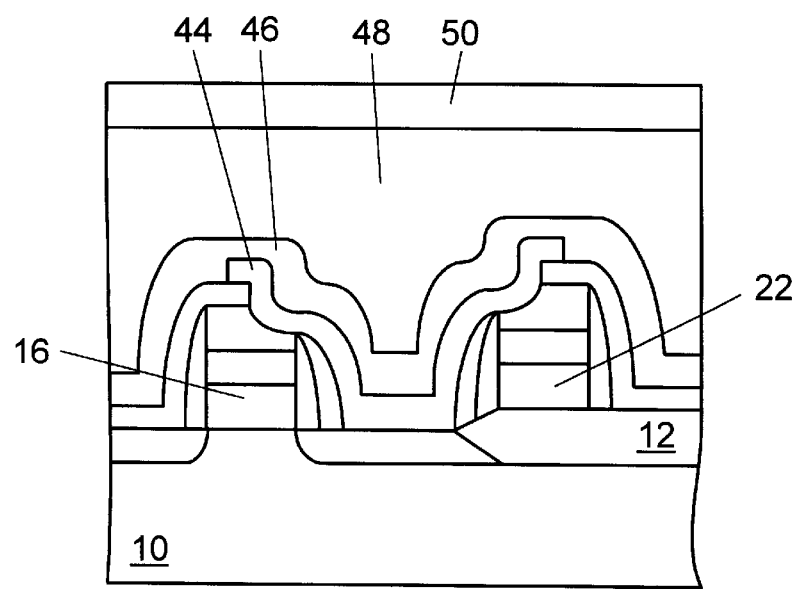

Next, a planarized oxide layer is provided over the FIG. 5 structure, preferably using a series of oxide deposition steps that readily provide a planarized surface in a reliable and manufacturable process. One component of the thick oxide layer is an approximately 1500 Å thick layer of oxide 46 deposited in an atmospheric pressure chemical vapor deposition (APCVD) process. The APCVD oxide layer 46 is preferably undoped and provides a conformal oxide layer that should not flow in a subsequent reflow process. Next, a layer of boron phosphorus silicate glass 46 is deposited to a thickness of approximately 7500 Å. The BPSG oxide layer 46 has doping levels appropriate to allow the layer to readily reflow. Next, the device is provided to a reflow furnace at a temperature of about 800° C. for between about 20 minutes to one hour to allow the BPSG layer 48 to reflow, at least partially planarizing the device. Further planarization is accomplished by providing a layer of spin-on-glass (SOG) 50 or, more precisely, plural layers of SOG with annealing steps between the deposition of successive layers. A total SOG layer 50 thickness of about 2700 Å is appropriate to achieve the desired level of planarization for the surface of the multilayer oxide structure. The device with this sequence of oxide layers is shown in FIG. 6.

Figure 7:
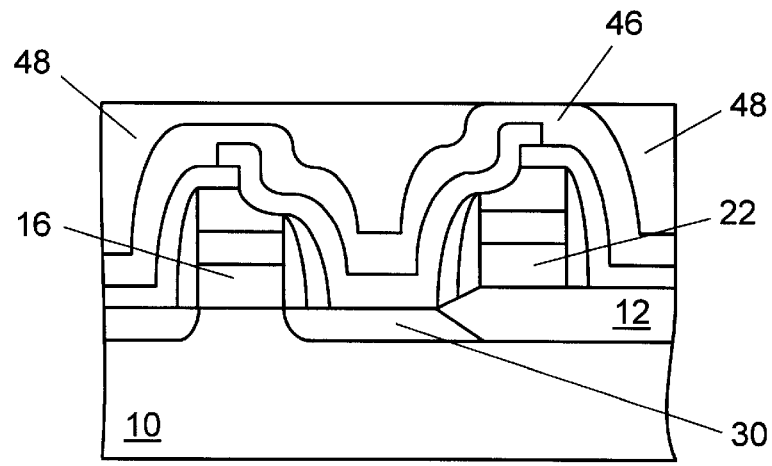

Planarization continues by subjecting the multilayer oxide structure to an etch back process in which approximately 9,000 Å of oxide are removed from the surface of the device in a blanket etching process. An appropriate etching process might be performed in the TEL 5000 system using a $CF_4$ source gas, or another high rate dielectric etching process such as that identified above. By etching approximately 9,000 Å of oxide from the surface of the device, the SOG layer will be completely removed and substantially all of the BPSG layer will be removed. The resulting structure is shown in FIG. 7, and it can be seen that the oxide layer consisting of the exposed surfaces of BPSG layer 48 and APCVD oxide layer 46 has a substantially planar surface. Alternate methods of achieving a planarized oxide layer might be implemented, including one solely using a doped glass reflow process or one in which a single thick oxide layer is deposited and planarized using chemical mechanical polishing. The illustrated process flow is presently preferred because it provides an acceptable level of planarization more cheaply and with higher throughput than CMP processes. However formed, the planarized oxide layer can now be used in forming a vertical step adjacent the capacitor electrode contact which will provide additional height and surface area for the lower capacitor electrode formed in accordance with particularly preferred embodiments of the present invention. The planarized oxide layer will also facilitate the subsequent processing steps used to form a high surface area charge storage capacitor.

Figure 8:
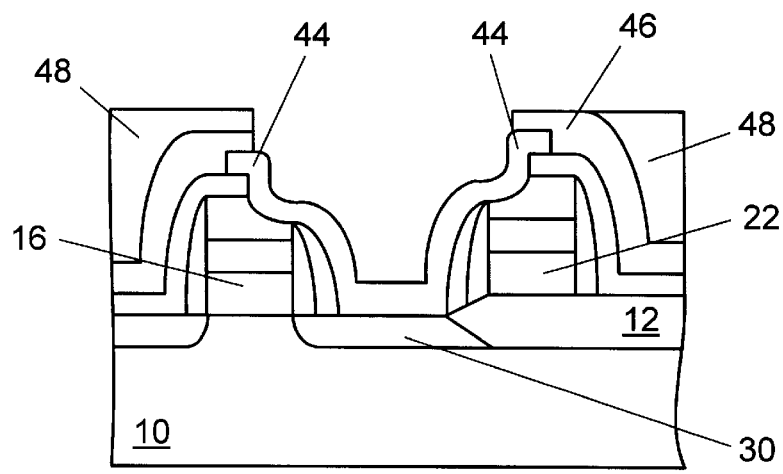

FIG. 8 shows the planarized oxide layer 46, 48 after etching has opened a contact opening area to expose part of the surface of pad polysilicon layer 44 and to form a step structure extending vertically above a surface of the pad polysilicon layer. This structure is formed by first providing a photoresist etch mask over the surface of the FIG. 7 structure having an opening preferably narrower than the lateral extent of the pad polysilicon layer 44 and preferably substantially centered on the pad polysilicon layer 44. An oxide etching process is then performed to remove oxide. This oxide etching process may be performed in the same manner discussed above and is preferably continued until it exposes the central portion of the polysilicon pad 44. The polysilicon pad 44 acts to protect the source/drain region 30 in this process, limiting the etching damage to the source/drain region 30 and thereby limiting leakage from the source/drain region 30 that might arise if the source/drain region were damaged. The etching mask is then stripped to produce the structure shown in FIG. 8. As illustrated, the remaining portion of the BPSG layer 48, if any, and the remaining portion of the undoped CVD oxide 46 have substantially vertical sidewalls extending above the polysilicon pad 44. This step provides vertical height and additional surface area for the lower capacitor electrode.

Figure 9:
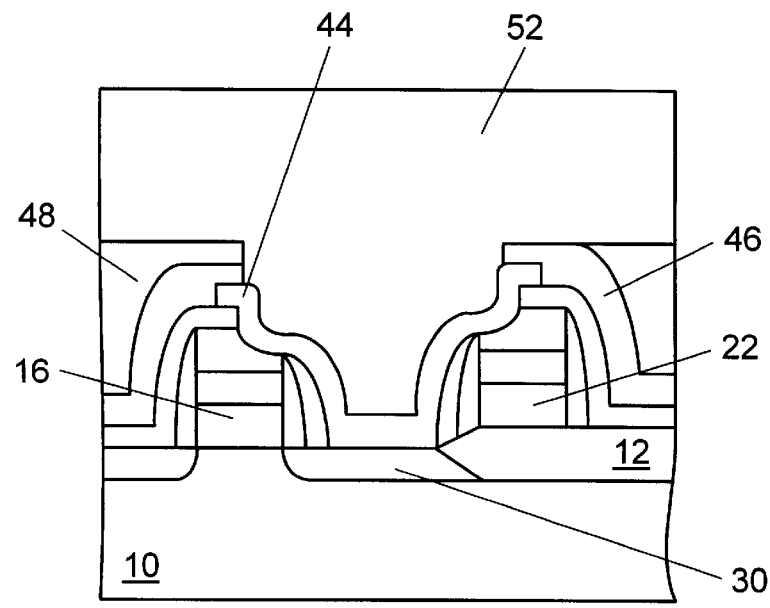
Figure 10:
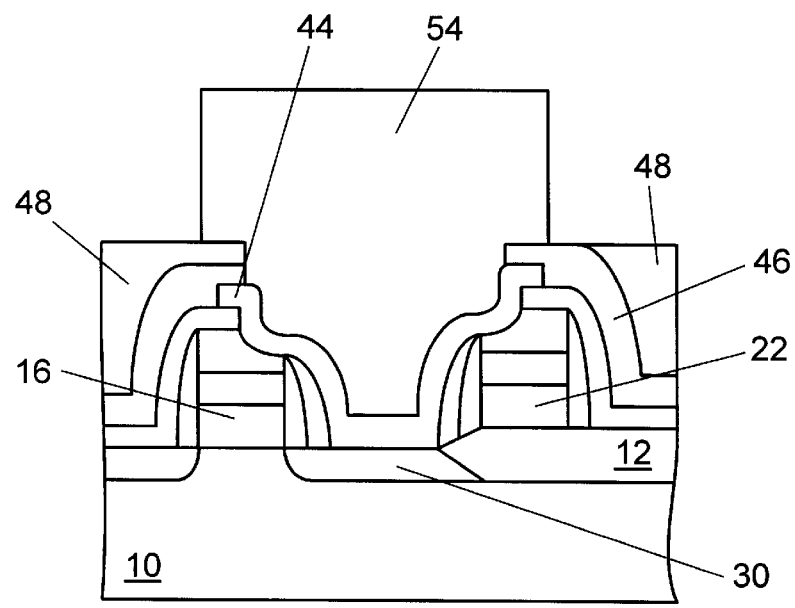

A third layer of polysilicon is then deposited over the surface of the FIG. 8 device. Preferably, a thick layer of polysilicon on the order of approximately 5000 Å or more is deposited in an LPCVD process (FIG. 9). This thick polysilicon layer 52 fills the cupped opening defined by the exposed surface of polysilicon pad 44 and extends above the step in the planarized oxide layer and over the surface of the planarized oxide layer 46, 48. Generally, the polysilicon layer deposited in this fashion will have a substantially planar upper surface. If this is not the case, then it is preferred that this surface be planarized in either an etch back process or a chemical mechanical polishing process. The thick polysilicon layer 52 is preferably doped in situ from a phosphine or arsine source gas during deposition to avoid the possibly prolonged annealing process that might be required if ion implantation or diffusion were used to dope the thick polysilicon layer 52. The process now laterally defines the lower capacitor electrode for the illustrated DRAM cell. A polysilicon etch mask is provided on the surface of the thick polysilicon layer 52. A conventional polysilicon etching process, for example using a Lam Research TCP etching system with an etchant derived from a mixture of source gases including HCl and HBr, is performed to etch first through the thick polysilicon layer 52, stopping the etching process on the planarized upper surface of oxide layer 46, 48. Most preferably, the patterned thick polysilicon layer 54 extends over the stepped opening in the planarized oxide layer 46, 48 and laterally on either side above the planarized oxide layer, as shown in FIG. 10.

Figure 11:
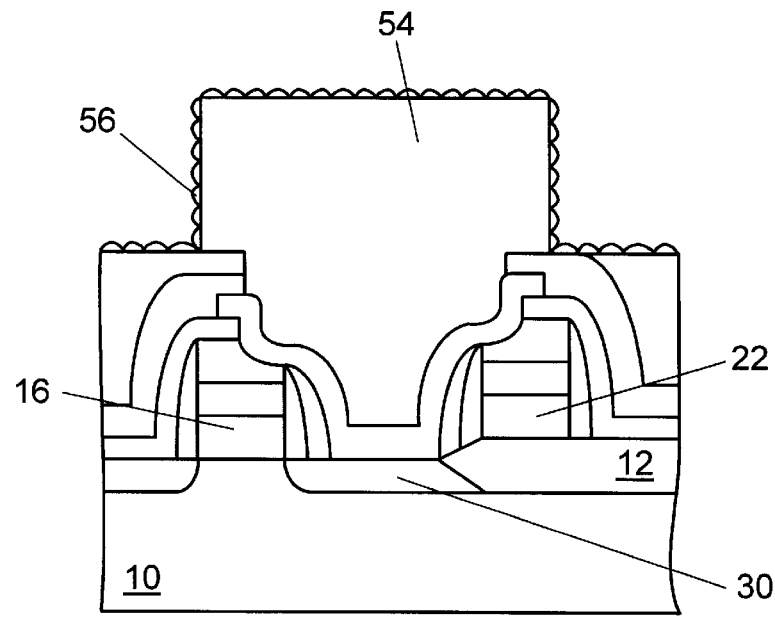
Figure 12:
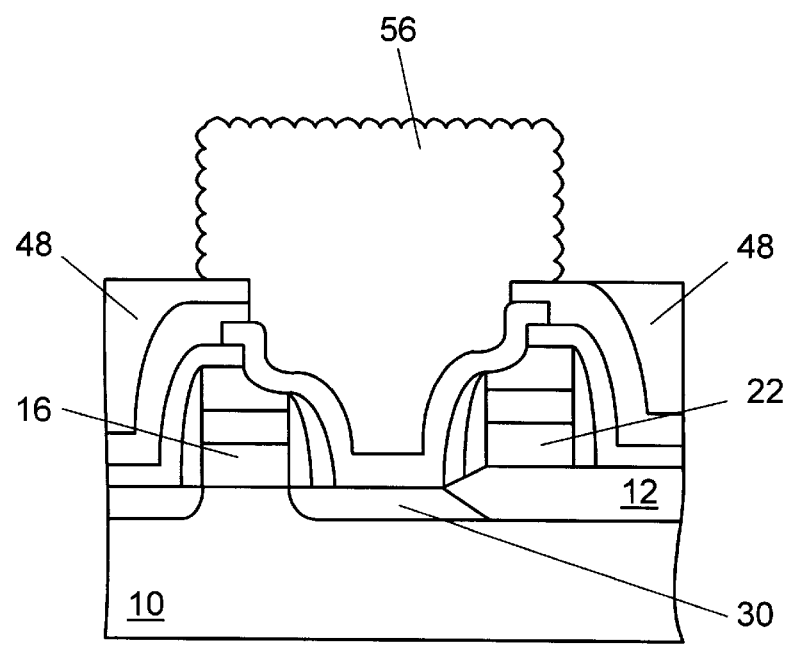
Figure 13:
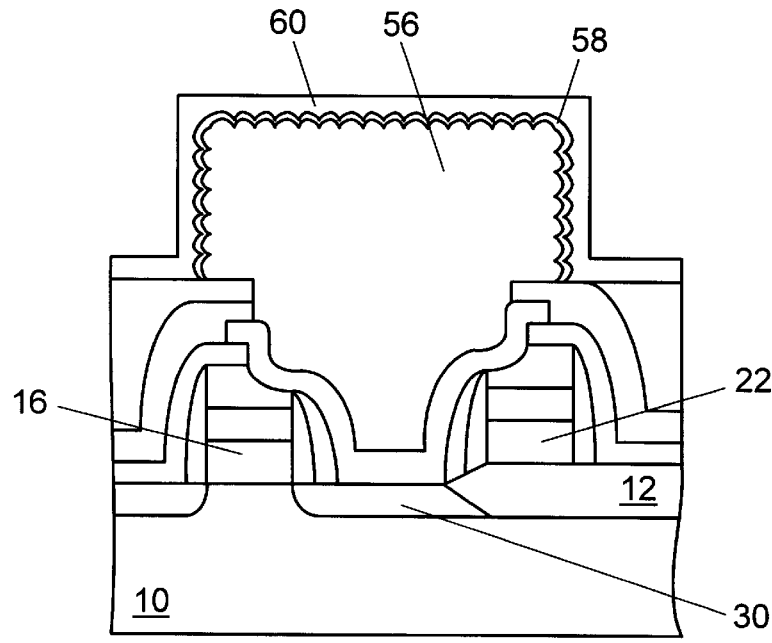
Figure 14:
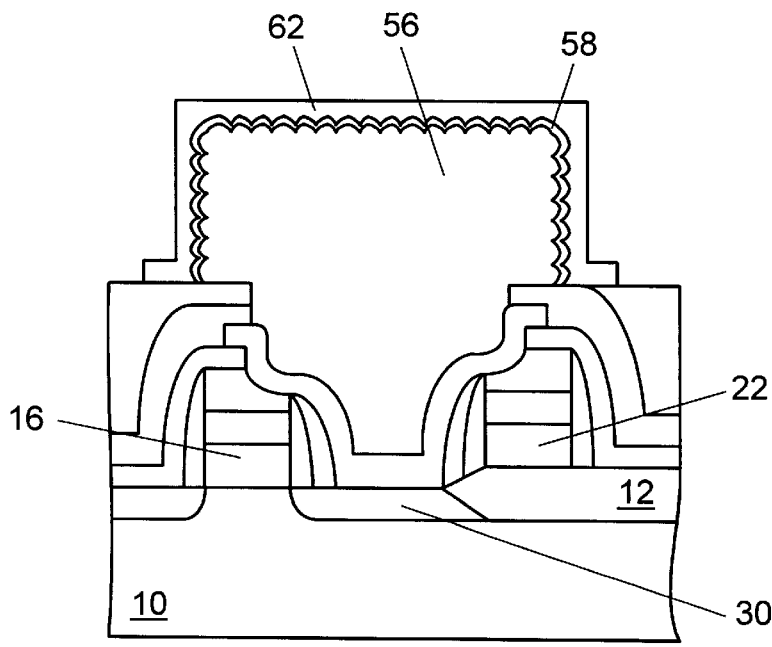

To further improve the charge storage characteristics of the DRAM capacitor electrode of the present invention, it is preferred that a layer of hemispherical grained silicon (HSG-Si) be provided on the surface of the patterned polysilicon layer 54. As is known in the art, hemispherical grained silicon, also known as textured polysilicon, can be deposited on a silicon surface in an LPCVD process in which the deposition substrate temperature is maintained at about 555° C. to about 590° C. This process is preferably continued to deposit approximately 50–100 nanometers of hemispherical grain silicon to form layer 56 on the top and sides of the patterned polysilicon layer 54 as illustrated in FIG. 11. The resulting layer of hemispherical grained silicon will have grain sizes on the order of 50–100 nanometers with grain separations on the order of 50–100 nanometers. This hemispherical grained silicon layer 56 can be doped by ion implantation, for example by implantation of phosphorus at an energy of about 30 KeV to a dosage of about $8 \times 10^{15}/cm^2$, or by subsequent diffusion from the patterned polysilicon layer 54. More preferably, the HSG-Si layer is not doped to better facilitate a polysilicon etch back process. For the embodiments illustrated in FIGS. 12–14, an etch back process is preferably performed on the HSG-Si surface 54 to transfer the topology of the hemispherical grained silicon surface layer to the underlying polysilicon layer. This might be accomplished using a generally isotropic etching process using, for example, plasma etching with an etchant derived from chlorine gas ($Cl_2$). The process is preferably continued to completely remove the HSG-Si layer and to transfer the topology of the HSG-Si layer to the underlying polysilicon, providing a textured polysilicon lower capacitor electrode 56, as shown in FIG. 12. This etch back process also removes the HSG-Si from the surface of the planarized oxide layer without substantially etching the oxide layer.

Next, a layer of capacitor dielectric material 58 (FIG. 13) is provided over all of the exposed surfaces of the lower charge storage capacitor electrode. A capacitor dielectric material might be provided by depositing a thin layer of CVD silicon nitride (~30–50 Å) and growing a thin layer of oxide (~5–15 Å) on the nitride layer to form the dielectric material known as "NO." In alternate embodiments of the present invention, a higher dielectric constant capacitor dielectric material is chosen. In an alternate embodiment, a layer of tantalum pentoxide, nominally $Ta_2O_5$, is deposited in a chemical vapor deposition (CVD) process from a source gas mixture consisting of Ta $(OC_2H_5)_5+O_2$. The tantalum pentoxide capacitor dielectric might be deposited in a high density deposition system such as the LAM 9800 Integrity system to a thickness of between about 20–140 Å. The particular thickness chosen for the capacitor dielectric is preferably thin to maximize the resulting capacitance but sufficiently thick to ensure that the capacitor dielectric layer 58 does not have unacceptable pin holes or an unacceptable breakdown voltage. Because the preferred capacitor dielectric layer is deposited at least in part by CVD, the capacitor dielectric layer 58 will typically extend over the surfaces of the device that are exposed during this dielectric formation process.

An upper capacitor electrode 60 is next formed over the DRAM structure in accordance with preferred embodiments of the present invention. For most embodiments, the upper capacitor electrode 60 includes a layer of doped polysilicon deposited to a thickness of 1500–2500 Å. When a tantalum pentoxide capacitor dielectric is used, it is preferred that titanium nitride (TiN) be used to form at least the lower surface of the upper capacitor electrode. Most often, the entire upper capacitor electrode can be formed from titanium nitride due to the high conductivity of titanium nitride. Most preferably, the titanium nitride is deposited over the capacitor dielectric in a low temperature process. Such a low temperature process is preferred because the high dielectric constant capacitor dielectrics preferably used in the present invention typically include oxygen as a constituent element. Thus, any high temperature processes can cause oxide to form at the surface of the lower capacitor electrode. Any such oxide layer formed will constitute a reduced capacitance in series with the capacitance provided by the high dielectric constant material, which would undesirably reduce the capacitance of the DRAM charge storage capacitor. Accordingly, the titanium nitride layer is preferably deposited to a thickness of 1000 Å or less using a sputtering process and a relatively low substrate temperature or, more preferably, the titanium nitride layer is deposited in a chemical vapor deposition (CVD) process. Titanium nitride can be deposited by CVD from $TiCl_4+NH_3$ source gases at a comparatively low substrate temperature. The CVD process has the further advantage over sputtering that CVD is much less likely to heat the deposition substrate during the deposition process.

Conductive layer 14 is then patterned to laterally define the upper capacitor electrode 62 and to remove the upper capacitor electrode from above the source/drain region 28 that forms part of the bit line contact. Processing continues to cover the upper capacitor electrode 62 with an interlayer insulating layer, for example by depositing boron phosphorus silicate glass (BPSG) in a CVD process. A bit line contact opening is then formed through the interlayer insulating layer and the contact opening is filled with a metal interconnect and a metal bit line is provided. Further conventional processing is performed to complete the formation of the DRAM cell and support circuitry.

The present invention has been described in terms of certain preferred embodiments. Those of ordinary skill in the art will appreciate that certain modifications and variations on the embodiments described herein may be made within the general spirit of the present invention. As such, the scope of the present invention is not to be limited to the particular embodiments described herein. Rather, the scope of the present invention is to be determined from the claims which follow.

What is claimed:

1. A method of making an integrated circuit device, comprising:
   providing a transfer FET having a gate electrode and a source/drain region and providing a wiring line spaced from the gate electrode;
   depositing a dielectric layer over the transfer FET and the wiring line;
   etching the dielectric layer to expose a surface of the source/drain region, portions of the dielectric layer remaining over the gate electrode and the wiring line;
   depositing and patterning a first conductive layer to form a conductive pad in contact with the source/drain region, edges of the conductive pad being positioned over the gate electrode and the wiring line;
   depositing and planarizing an insulating layer over the first conductive layer, the insulating layer being deposited to a sufficient thickness so that a surface of the planarized insulating layer extends above the edge of the conductive pad over the gate electrode;
   after forming the planarized insulating layer, forming an opening in the planarized insulating layer extending from the surface of the planarized insulating layer to expose a surface of the conductive pad, edges of the opening being positioned on the surface of the conductive pad;
   after forming the opening, providing a second conductive layer to fill the opening in the planarized insulating layer, the second conductive layer being in contact with the exposed surface of the conductive pad;
   providing an etching mask over the second conductive layer and etching through the second conductive layer to form a patterned second conductive layer and to expose the surface of the planarized insulating layer, the patterned second conductive layer serving as a bottom capacitor electrode;
   providing a capacitor dielectric layer over the patterned second conductive layer; and
   providing an upper capacitor electrode over the capacitor dielectric layer.

2. The method of claim 1, further comprising the step of forming a textured conductive surface on the patterned second conductive layer before providing the capacitor dielectric layer.

3. The method of claim 2, wherein the step of forming a textured conductive surface comprises the step of depositing a layer of hemispherical grained silicon on a polysilicon surface of the patterned second conductive layer.

4. The method of claim 2, wherein the step of forming a textured conductive surface comprises the steps of:
   depositing a layer of hemispherical grained silicon on a surface of the patterned second conductive layer; and
   etching back the layer of hemispherical grained silicon to form a textured surface on the patterned second conductive layer.

5. The method of claim 1, wherein the patterned second conductive layer extends on the surface of the planarized insulating layer on either side of the opening in the planarized insulating layer.

6. The method of claim 1, wherein dielectric layer is a layer of silicon oxide approximately 1000–2000 Å in thickness.

7. The method of claim 6, wherein the first conductive layer comprises doped polysilicon.

8. The method of claim 7, wherein the first conductive layer is doped in situ during a chemical vapor deposition process.

9. The method of claim 8, wherein the planarized insulating layer comprises silicon oxide.

10. The method of claim 9, wherein the step of forming an opening uses a surface of the conductive pad adjacent the source/drain region as an etch stop.

11. The method of claim 1, wherein the edges of the conductive pad are separated from the gate electrode and the wiring line by the remaining portions of the dielectric layer.

12. The method of claim 1, wherein the step of patterning the first conductive layer uses the dielectric layer as an etch stop.

13. The method of claim 1, wherein the second conductive layer is deposited over the conductive pad.

14. The method of claim 1, wherein a lower surface of the second conductive layer is separated from the source/drain region only by the conductive pad.

15. The method of claim 1, wherein said forming an opening uses the conductive pad as an etch stop layer.

16. The method of claim 1, wherein each of the steps are performed in order.

17. The method of claim 1, wherein said providing a second conductive layer forms the second conductive layer in direct contact with the conductive pad, with the second conductive layer and the conductive pad forming a lower capacitor electrode.

18. The method of claim 17, wherein said providing a capacitor dielectric layer forms the capacitor dielectric layer in direct contact with the second conductive layer.

19. The method of claim 18, wherein said providing an upper capacitor electrode forms the upper capacitor electrode in direct contact with the capacitor dielectric layer.

20. The method of claim 19, wherein said forming an opening uses the conductive pad as an etch stop layer.

21. A method of making an integrated circuit device, comprising:

providing a substrate;

forming a transfer field effect transistor and a wiring line on the substrate, the transfer field effect transistor having a gate electrode and a source/drain region;

depositing a first insulating layer on the transfer field effect transistor;

etching the first insulating layer to expose a surface of the source/drain region, portions of the first insulating layer remaining over the gate electrode and the wiring line;

depositing and patterning a conductive layer to form a conductive pad in contact with the source/drain region, edges of the conductive pad being positioned over the gate electrode and the wiring line;

depositing and planarizing a second insulating layer over the conductive pad, the second insulating layer being deposited to a sufficient thickness so that a surface of the planarized second insulating layer extends above the edge of the conductive pad over the gate electrode;

after forming the planarized second insulating layer, forming an opening in the planarized second insulating layer extending from the surface of the planarized second insulating layer to expose a surface of the conductive pad, edges of the opening being positioned on the surface of the conductive pad;

after forming the opening, forming a bottom capacitor electrode to fill the opening in the planarized second insulating layer, wherein the bottom capacitor electrode only partially covers the surface of the planarized second insulating layer;

providing a capacitor dielectric layer on the bottom capacitor electrode; and providing an upper capacitor electrode on the capacitor dielectric layer.

22. The method of claim 1, wherein said insulating layer in said depositing and planarizing operation comprises a multilayer oxide structure.

23. The method of claim 1, wherein said providing a transfer FET includes providing a first spacer on a sidewall of at least one of said gate electrode and said wiring line, and wherein said etching the dielectric layer forms a second spacer alongside the first spacer.

24. The method of claim 1, wherein said providing a transfer FET includes forming a protective oxide cap over at least one of said gate electrode and said wiring line, and wherein said etching the dielectric layer removes only a portion of the protective oxide cap over said at least one of the gate electrode and the wiring line.

\* \* \* \* \*